United States Patent
Lee et al.

(10) Patent No.: US 10,079,313 B2
(45) Date of Patent: Sep. 18, 2018

(54) GRAPHENE ELECTRONIC DEVICE HAVING CHANNEL LAYER INCLUDING GRAPHENE ISLANDS AND METHOD OF FABRICATING THE SAME

(71) Applicants: Samsung Electronics Co., Ltd., Suwon-si, Gyeonggi-do (KR); Research & Business Foundation, SUNGKYUNKWAN UNIVERSITY, Suwon-si, Gyeonggi-do (KR)

(72) Inventors: Kiyoung Lee, Seoul (KR); Jinseong Heo, Seoul (KR); Woojong Yu, Suwon-si (KR); Yongseon Shin, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 15/237,107

(22) Filed: Aug. 15, 2016

(65) Prior Publication Data
US 2017/0054033 A1 Feb. 23, 2017

(30) Foreign Application Priority Data
Aug. 18, 2015 (KR) .......... 10-2015-0116103

(51) Int. Cl.
*H01L 29/786* (2006.01)
*H01L 29/16* (2006.01)
(Continued)

(52) U.S. Cl.
CPC .. *H01L 29/78696* (2013.01); *H01L 21/02527* (2013.01); *H01L 21/02565* (2013.01);
(Continued)

(58) Field of Classification Search
CPC ......... H01L 29/78684; H01L 29/78696; H01L 29/1606; H01L 29/247; H01L 29/267; H01L 29/78681
See application file for complete search history.

(56) References Cited

U.S. PATENT DOCUMENTS

| 2009/0142839 A1 | 6/2009 | Primiano | |
|---|---|---|---|
| 2011/0201201 A1* | 8/2011 | Arnold | B82Y 30/00 438/694 |

(Continued)

FOREIGN PATENT DOCUMENTS

| KR | 20110115105 A | 10/2011 |
|---|---|---|
| KR | 20120022164 A | 3/2012 |

(Continued)

OTHER PUBLICATIONS

Zeng, et al. "Fabrication of Graphene Nanomesh by Using an Anodic Aluminum Oxide Membrane as a Template", Adv. Mater, vol. 24, pp. 4138-4142 (2012).
(Continued)

*Primary Examiner* — Douglas Menz
(74) *Attorney, Agent, or Firm* — Harness, Dickey & Pierce, P.L.C.

(57) ABSTRACT

A graphene electronic device includes a gate insulating layer on a conductive substrate, a channel layer on the gate insulating layer, and a source electrode on one end of the channel layer and a drain electrode on another end of the channel layer. The channel layer includes a semiconductor layer and a graphene layer in direct contact with the semiconductor layer, and the graphene layer includes a plurality of graphene islands spaced apart from each other.

15 Claims, 7 Drawing Sheets

(51) Int. Cl.
| | |
|---|---|
| *H01L 29/24* | (2006.01) |
| *H01L 29/267* | (2006.01) |
| *H01L 29/66* | (2006.01) |
| *H01L 21/04* | (2006.01) |
| *H01L 21/02* | (2006.01) |

(52) U.S. Cl.
CPC ........ *H01L 21/042* (2013.01); *H01L 29/1606* (2013.01); *H01L 29/247* (2013.01); *H01L 29/267* (2013.01); *H01L 29/66045* (2013.01); *H01L 29/66742* (2013.01); *H01L 29/66969* (2013.01); *H01L 29/78681* (2013.01); *H01L 29/78684* (2013.01); *H01L 29/78693* (2013.01)

(56) References Cited

U.S. PATENT DOCUMENTS

| | | | |
|---|---|---|---|
| 2011/0291068 A1* | 12/2011 | Kobayashi | H01L 29/66742 257/9 |
| 2012/0088039 A1* | 4/2012 | Yu | C01B 32/186 427/596 |
| 2012/0255407 A1 | 10/2012 | Maurer et al. | |
| 2012/0301953 A1 | 11/2012 | Duan et al. | |
| 2013/0146847 A1* | 6/2013 | Adkisson | H01L 29/66045 257/29 |
| 2014/0021444 A1 | 1/2014 | Yi et al. | |
| 2014/0034899 A1* | 2/2014 | Ahn | H01L 29/06 257/9 |
| 2014/0158989 A1* | 6/2014 | Byun | H01L 29/452 257/29 |
| 2015/0110998 A1* | 4/2015 | Borrelli | C23C 16/26 428/116 |
| 2015/0194233 A1* | 7/2015 | Jeong | H01B 1/04 428/336 |
| 2015/0206748 A1* | 7/2015 | Sumant | H01L 21/02376 438/481 |
| 2016/0111180 A1* | 4/2016 | Joo | H01B 1/04 428/408 |

FOREIGN PATENT DOCUMENTS

| | | |
|---|---|---|
| KR | 20120112087 A | 10/2012 |
| KR | 10-2014-0045841 | 4/2014 |

OTHER PUBLICATIONS

Yu, et al. "Vertically stacked multi-heterostructures of layered materials for logic transistors and complementary inverters", Nature Materials, vol. 12, pp. 246-252 (2013).

Liu, et al. "Highly Flexible Electronics from Scalable Vertical Thin Film Transistors" Nano Letters, American Chemical Society, pp. 1413-1418 (2014).

Yamada, et al. "Subnanometer Vacancy Defects Introduced on Graphene by Oxygen Gas", Journal of American Chemical Society, vol. 136, pp. 2232-2235 (2014).

Carlsson, et al. "Two-Step Mechanism for Low-Temperature Oxidation of Vacancies in Graphene", Physical Review Letters, vol. 102, No. 6, pp. 166104-1-166104-4, (2009).

Shin, et al. "Tuning On-Off Current Ratio and Field-Effect Mobility in a MoS2-Graphene Heterostructure via Schottky Barrier Modulation", ASC Nano, pp. 5790-5798, (2014).

Heo et al., "Graphene and Thin-Film Semiconductor Heterojunction Transistors Integrated on Wafer Scale for Low-Power Electronics", Nano Letters, vol. 13, pp. 5967-5971, American Chemical Society (2013).

Yu et al., "Vertically stacked multi-heterostructures of layered materials for logic transistors and complementary inverters", Nature Materials vol. 12, pp. 246-252 (2013).

Liu et al., "Highly Flexible Electronics from Scalable Vertical Thin Film Transistors", Nano Letters, vol. 14, pp. 1413-1418, American Chemical Society (2014).

Yang et al., "Graphene Barrister, a Triode Device with a Gate-Controlled Schottky Barrier", vol. 336, Science, pp. 1140-1144 (2012)

* cited by examiner

GRAPHENE ELECTRONIC DEVICE HAVING CHANNEL LAYER INCLUDING GRAPHENE ISLANDS AND METHOD OF FABRICATING THE SAME

CROSS-REFERENCE TO RELATED APPLICATION

This application claims the benefit of Korean Patent Application No. 10-2015-0116103, filed on Aug. 18, 2015, in the Korean Intellectual Property Office, the disclosure of which is incorporated herein in its entirety by reference.

BACKGROUND

1. Field

Example embodiments relate to graphene electronic devices having a channel layer including graphene islands and methods of fabricating the graphene electronic devices.

2. Description of the Related Art

Graphene has relatively high charge mobility and relatively high electrical conductivity. Due to these characteristics, use of graphene in multifunctional devices using relatively low power has obtained attention. However, because graphene does not have a band gap despite its desirable electrical characteristics, it is difficult to use graphene as a channel of a transistor.

A field effect transistor (FET) having a channel formed of nano-ribbon graphene or graphene with a nano-hole may have a predetermined or given band gap, but the FET may have a relatively low on/off current ratio.

An amorphous oxide semiconductor has been researched as a material for a next-generation transparent device having improved transparency. When the amorphous oxide semiconductor is fabricated by a solution process, a fabrication process may be simple and fabrication costs may be reduced. For example, indium zinc oxide (IZO) fabricated by the solution process may have a relatively lower mobility than IZO fabricated by a RF-sputtering process according to device characteristics. A solution type may show a mobility of about 1 $cm^2$ $V^{-1}$ $s^{-1}$ to about 15 $cm^2$ $V^{-1}$ $s^{-1}$, while a RF-Sputtering type may show the mobility of about 15 to about 60 $cm^2$ $V^{-1}$ $s^{-1}$.

A graphene electronic device may be a FET, a sensor, a photo detector, etc.

SUMMARY

Example embodiments provide graphene electronic devices having a channel layer including a plurality of graphene islands on a semiconductor layer and methods of manufacturing the same.

Additional aspects will be set forth in part in the description which follows and, in part, will be apparent from the description, or may be learned by practice of the presented example embodiments.

According to example embodiments, a graphene electronic device includes a conductive substrate, a gate insulating layer on the conductive substrate, a channel layer on the gate insulating layer, and a source electrode on one end of the channel layer and a drain electrode on another end of the channel layer. The channel layer includes a semiconductor layer and a graphene layer in direct contact with the semiconductor layer, and the graphene layer includes a plurality of graphene islands spaced apart from each other.

The semiconductor layer may include one of silicon, an organic semiconductor, an amorphous oxide semiconductor, a two-dimensional transition metal chalcogenide, and a Group III/V compound semiconductor.

The semiconductor layer may include InZnO.

The semiconductor layer may have a thickness of about 1 to about 30 nm.

The plurality of graphene islands may be spaced apart from each other at a gap of about 1 nm to about 100 nm.

The plurality of graphene islands may include 1 to 3 layers of graphene.

The plurality of graphene islands may be between the gate insulating layer and the semiconductor layer.

According to example embodiments, a graphene electronic device includes a substrate, a channel layer on the substrate, a gate insulating layer on the channel layer, a gate electrode on the gate insulating layer, and a source electrode connected to one end of the channel layer and a drain electrode connected to another end of the channel layer. The channel layer includes a semiconductor layer and graphene layer in direct contact with the semiconductor layer, and the graphene layer includes a plurality of graphene islands spaced apart from each other.

According to example embodiments, a method of fabricating a graphene electronic device includes forming a gate insulating layer on a conductive substrate, placing a graphene sheet on the gate insulating layer, coating a semiconductor precursor solution onto the graphene sheet, heat-treating the substrate and the coated graphene sheet to form a graphene layer including a plurality of graphene islands, forming a semiconductor layer by oxidizing the semiconductor precursor solution, and forming a source electrode on one end of the semiconductor layer and the graphene layer and a drain electrode on another end of the semiconductor layer and the graphene layer.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
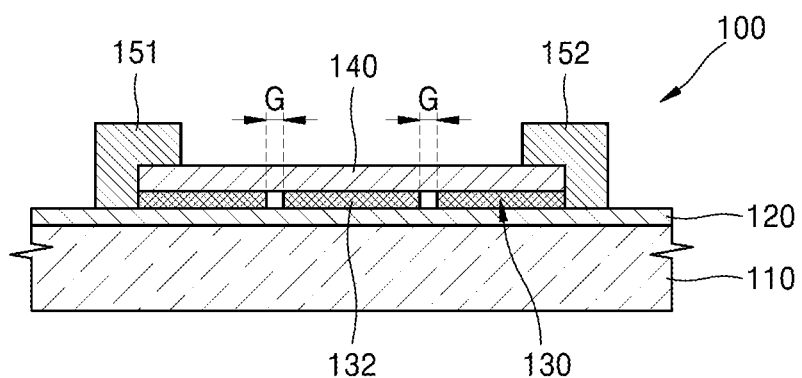
FIG. 1 is a cross-sectional view of a graphene electronic device having a channel layer including graphene islands according to example embodiments.

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items.

It will be understood that when a layer, region, or component is referred to as being "formed on" another layer, region, or component, it can be directly or indirectly formed on the other layer, region, or component. That is, for example, intervening layers, regions, or components may be present.

An expression used in the singular encompasses the expression of the plural, unless it has a clearly different meaning in the context.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a graphene electronic device 100 having a channel layer including graphene islands according to example embodiments.

Referring to FIG. 1, a gate insulating layer 120 may be on a conductive substrate 110. One layer formed by a plurality of graphene islands 132, hereinafter referred to as a graphene layer 130, may be placed on the gate insulating layer 120. A semiconductor layer 140 may be on the graphene layer 130. A source electrode 151 and a drain electrode 152 may be placed at respective ends of the semiconductor layer 140. The source electrode 151 and the drain electrode 152 may each be in contact with the semiconductor layer 140.

The conductive substrate 110 may function as a gate electrode. The conductive substrate 110 may include silicon, electrode metal, indium tin oxide (ITO), etc.

The gate insulating layer 120 may include silicon oxide or silicon nitride. The gate insulating layer 120 may include a polymer, e.g., polydimethylsiloxane (PDMS) and polyurethane. The gate insulating layer 120 may have a thickness of about 100 nm to about 300 nm.

The plurality of graphene islands 132 may be spaced apart from each other by a predetermined or given gap G. The plurality of graphene islands 132 may be in contact with the semiconductor layer 140. At least one gap G may be formed on the graphene layer 130 forming a current path between the source electrode 151 and the drain electrode 152. The gap G may have a width of about 1 nm to about 100 nm. The plurality of graphene islands 132 may include 1 to 3 layers of graphene and have graphene characteristics. Graphene islands 132 may be placed between the gate insulating layer 120 and the semiconductor layer 140.

Figure 2:
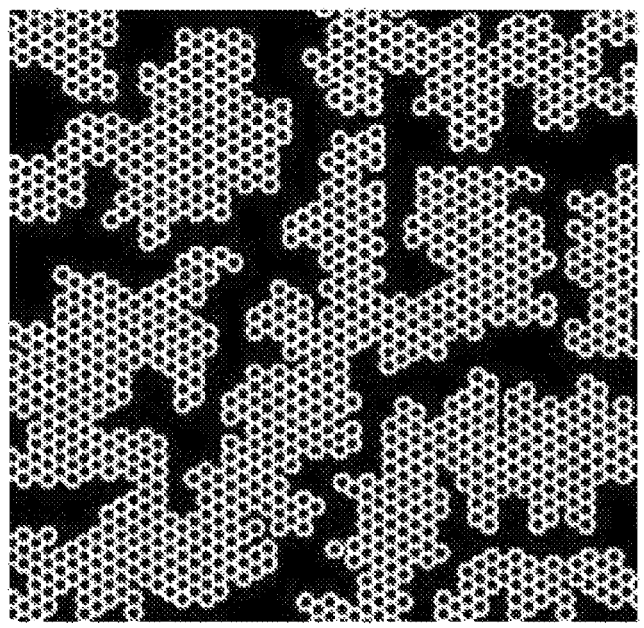
FIG. 2 is a plan view of graphene islands according to example embodiments.

FIG. 2 is a plan view of graphene islands according to example embodiments.

Referring to FIG. 2, the plurality of graphene islands may be irregularly formed. When both sides of graphene islands are respectively connected to the source electrode and the drain electrode, the current path between the source electrode and the drain electrode may need to pass the gaps in the graphene islands.

Referring back to FIG. 1, the semiconductor layer 140 may include silicon, an organic semiconductor, an amorphous oxide semiconductor, a two-dimensional transition metal chalcogenide, and a Group III/V compound semiconductor.

The organic semiconductor may include pentacene.

The amorphous oxide semiconductor may be ZnO, ZnAlO, InZnO, or InGaZnO. The amorphous oxide semiconductor may be transparent and stable. Because the amorphous oxide semiconductor may form the semiconductor layer 140 by using a precursor in a solution state, a fabrication process of the graphene electronic device 100 may be relatively easy and a fabrication cost of the graphene electronic device may be reduced.

The two-dimensional transition metal chalcogenide may include $MoS_2$, $WSe_2$, $WS_2$, $MoSe_2$, etc.

The graphene layer 130 and the semiconductor layer 140 may function as a channel layer of a field effect transistor (FET). The graphene layer 130 may have a relatively high mobility characteristic and the semiconductor layer 140 and the graphene layer 130 may form a Schottky barrier therebetween. Thus, a bandgap may be formed. Due to the bandgap, an on/off current ratio of the FET may increase.

The source electrode 151 and the drain electrode 152 may include materials well known in a semiconductor process and detailed descriptions thereof are omitted.

An operation of the graphene electronic device 100 is described below.

A predetermined or given voltage is applied between the source electrode 151 and the drain electrode 152. Accordingly, an electron is generated at the source electrode 151 and moves towards the drain electrode 152. The electron moves to an adjacent one of the graphene islands 132 through the semiconductor layer 140 in contact with the source electrode 151. In order to pass the current path between the source electrode 151 and the drain electrode 152, the electron that passed some of the graphene islands 132 needs to move to the semiconductor layer 140 and then, to other adjacent ones of the graphene islands 132. However, the electron may not move from the graphene islands 132 to the semiconductor layer 140 due to the Schottky barrier between the graphene islands 132 and the semiconductor layer 140.

When a predetermined or given turn-on voltage is applied to the conductive substrate 110 functioning as the gate electrode, the Schottky barrier is lowered and accordingly, the electron in the graphene islands 132 hops to the semiconductor layer 140 in contact with the graphene islands 132. Then, the electron moves to other adjacent ones of the graphene islands 132 on the current path. When another, different graphene island of the graphene islands 132 exists on the current path, the electron repeats a movement described above and finally moves to the drain electrode 152.

The graphene electronic device 100 according to example embodiments described above may function as a graphene transistor, however, example embodiments are not limited thereto. For example, the graphene electronic device 100 may be a sensor or a photo detector.

Figure 3:
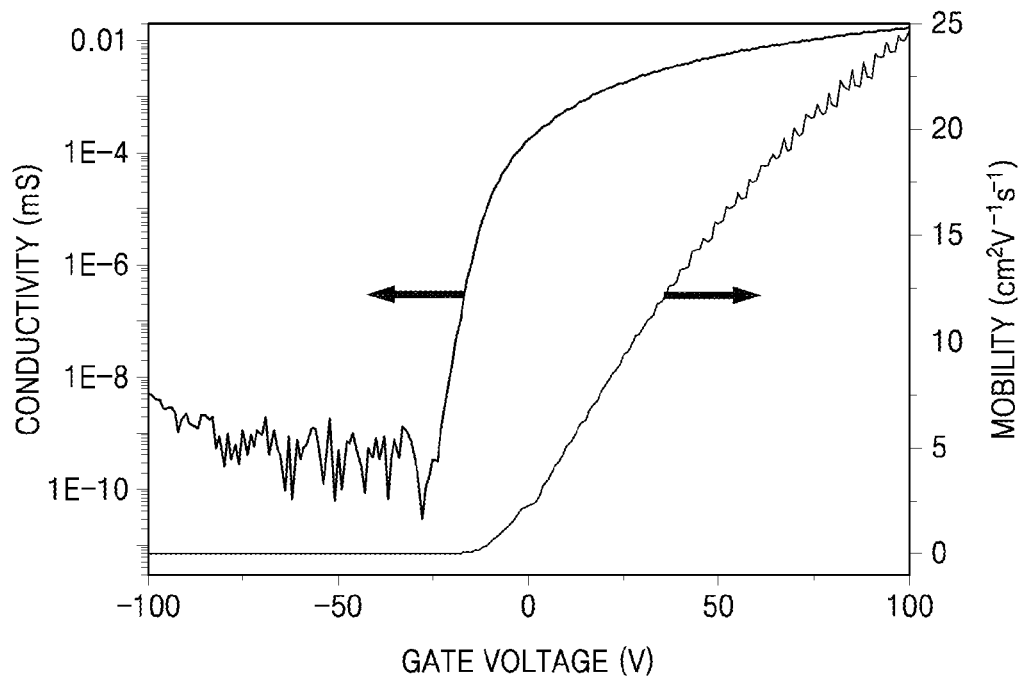
FIG. 3 is a graph illustrating electrical characteristics of a graphene electronic device according to example embodiments.

FIG. 3 is a graph illustrating electrical characteristics of a graphene electronic device according to example embodiments. The channel layer of the graphene electronic device may include an InZnO (IZO) semiconductor layer formed by a solution process and graphene islands on the IZO semiconductor layer.

Referring to FIG. 3, the graphene electronic device may have a charge mobility of about 24.7 $cm^2V^{-1}S^{-1}$, a conductivity of about $1.7 \times 10^{-2}$ mS, and an on/off current ratio of higher than about $10^6$ according to example embodiments.

Figure 4:
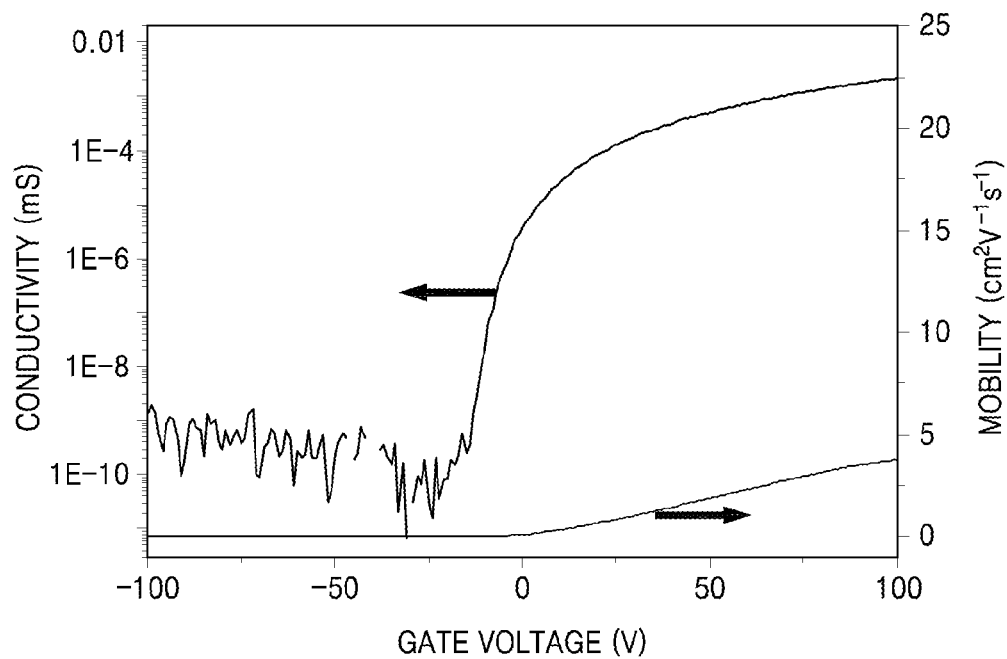
FIG. 4 is a graph illustrating electrical characteristics of a transistor having an IZO channel layer without a graphene layer.

FIG. 4 is a graph illustrating electrical characteristics of a transistor having an IZO channel layer without a graphene layer, hereinafter referred to as a conventional transistor. The IZO channel layer may be fabricated by the solution process.

Referring to FIG. 4, the conventional transistor may have a charge mobility of about 3.7 $cm^2V^{-1}S^{-1}$, a conductivity of about $2.1 \times 10^{-3}$ mS, and the on/off current ratio of higher than about $10^6$.

According to example embodiments, a graphene electronic device may have charge mobility and conductivity about 10 times higher than those of the conventional transistor, and the on/off current ratio of the conventional transistor.

According to example embodiments, a graphene electronic device may have the on/off current ratio of the conventional transistor, but the charge mobility may increase by utilizing a graphene layer including a plurality of graphene islands. An increase in the charge mobility may result from using the graphene layer.

FIGS. 5A through 5D are cross-sectional views illustrating a method of fabricating a graphene electronic device according to example embodiments. Like numerals are used to indicate like components as in the embodiment of FIG. 1 and detailed descriptions thereof are omitted.

Figure 5A:
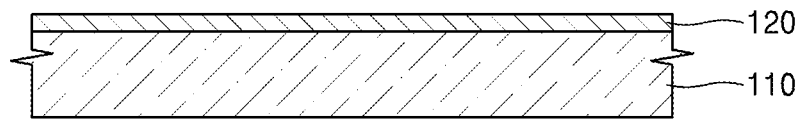
FIGS. 5A through 5D are cross-sectional views illustrating methods of fabricating a graphene electronic device according to example embodiments.

Firstly, referring to FIG. 5A, a conductive substrate 110 including silicon may be prepared. A gate insulating layer 120 including silicon oxide may be formed on a surface of the conductive substrate 110 through a heat-treatment of the conductive substrate 110.

Figure 5B:
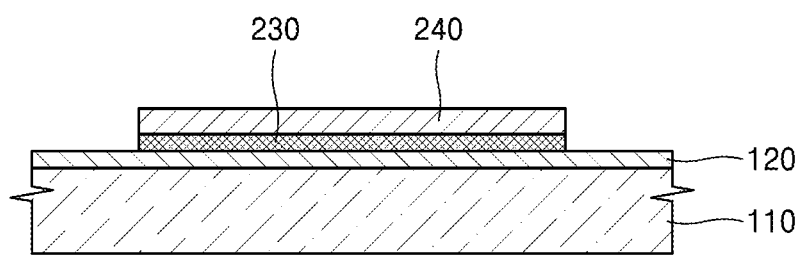

Referring to FIG. 5B, a graphene sheet 230 may be transferred onto the gate insulating layer 120. The graphene sheet 230 may include 1 to 3 layers of graphene. The graphene sheet 230 may be used by transferring graphene fabricated by a chemical vapor deposition (CVD) method. The graphene sheet 230 may be patterned to have a predetermined or given size.

An IZO precursor layer 240 may be fabricated on the graphene sheet 230 by coating a solution including IZO precursors onto the graphene sheet 230 using a spin coating method. An IZO precursor solution may be prepared by adding 0.03 mole of zinc acetate dihydrate [$Zn(OAc)_2 \cdot 2H_2O$] and 0.03 mole of indium nitrate hydrate [$In(NO_3)_3 \cdot 4H_2O$] to 2-methoxyethanol [2ME, Aldrich, 98%] so that a molar ratio of indium (In) and zinc (Zn) is 1:1, and stirring the solution for about 1 hour. The IZO precursor layer 240 may have a thickness of about 30 nm to about 50 nm.

Figure 5C:
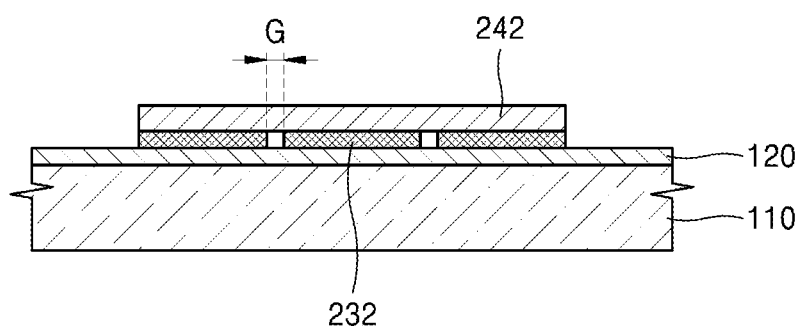

Referring to FIG. 5C, when the resulting structure may be under a heat-treatment at about 400° C. to about 500° C. for about 1 hour, oxygen may pass through the IZO precursor layer 240 to react with the graphene sheet 230 and a portion of the graphene sheet 230 may be removed. In other words, the graphene sheet 230 may be partially etched and graphene islands 232 may be formed as illustrated in FIG. 2. The graphene islands 230 may be spaced apart from each other by a predetermined or given gap G. The gap G may be about 1 nm to about 100 nm. The gap G may vary depending on a temperature of the heat-treatment, a duration of the heat-treatment, a material of the semiconductor layer and a thickness of the semiconductor layer.

During a process of the heat-treatment, the IZO precursor layer 240 may be oxidized to become an IZO semiconductor layer 242. The IZO semiconductor layer 242 may have a thickness of about 20 nm.

Figure 5D:
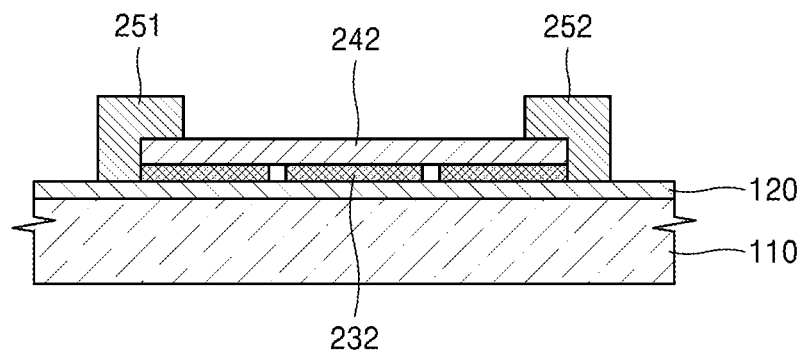

Referring to FIG. 5D, the source electrode 251 and the drain electrode 252 may be formed at both ends of the IZO semiconductor layer 242, after coating an electrode material (not shown) onto the substrate 110 and patterning the electrode material.

According to a method of fabricating a graphene electronic device of example embodiments, an IZO semiconductor layer may be fabricated by using a spin coating method and thus, the IZO semiconductor layer may be more easily fabricated, in comparison with fabricating the IZO semiconductor layer by using a conventional sputtering method.

In addition, when the IZO semiconductor layer is fabricated by an oxidation process, the graphene sheet may also be oxidized to form a plurality of graphene islands.

Figure 6:
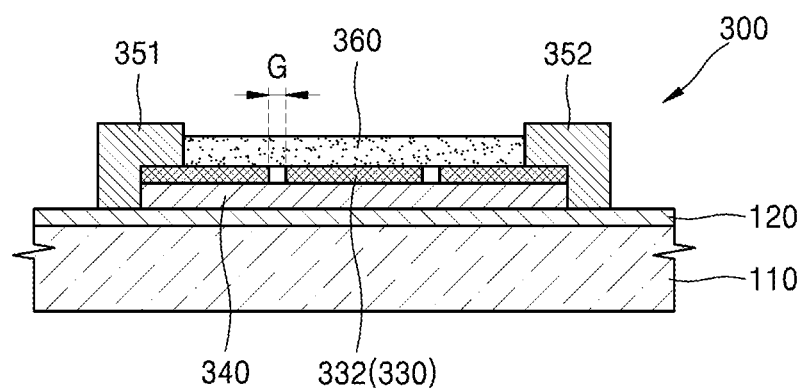
FIG. 6 is a cross-sectional view illustrating a structure of a graphene electronic device having a channel layer including graphene islands according to example embodiments.

FIG. 6 is a cross-sectional view illustrating a structure of a graphene electronic device having a channel layer including graphene islands according to example embodiments.

Like numerals are used to indicate like components as in the embodiment of FIG. 1 and detailed descriptions thereof are omitted.

Referring to FIG. 6, a gate insulating layer 120 may be on a conductive substrate 110. A semiconductor layer 340 may be on the gate insulating layer 120. One layer including a plurality of graphene islands 332, hereinafter referred to as a graphene layer 330, may be placed on the semiconductor layer 340. A source electrode 351 and a drain electrode 352 may be connected to both ends of the graphene layer 330. A protective layer 360 may further be placed on the graphene layer 330.

The plurality of graphene islands 332 may be spaced apart from each other by a predetermined or given gap G. The plurality of graphene islands 332 may be in contact with the semiconductor layer 340. A width of the gap G may be about 1 nm to about 100 nm. The plurality of graphene islands 332 may include 1 to 3 layers of graphene and have characteristics of graphene.

The plurality of graphene islands 332 may be transferred onto the semiconductor layer 340. However, example embodiments are not limited thereto. The plurality of graphene islands 332 may be fabricated by patterning a graphene sheet (not shown) after transferring the graphene sheet onto the semiconductor layer 340. In addition, the plurality of graphene islands 332 may be fabricated by a heat-treatment of the graphene sheet.

The source electrode 351 and the drain electrode 352 may be in direct contact with the graphene islands 332 in the graphene electronic device 300 of FIG. 6, and thus, a current path may be shorter than that of the graphene electronic device 100 of the example embodiment as illustrated in FIG. 1.

An operation of the graphene electronic device 300 in FIG. 6 may be well known to one skilled in the art from the description of the graphene electronic device 100 in FIG. 1, and a detailed description is omitted.

Figure 7:
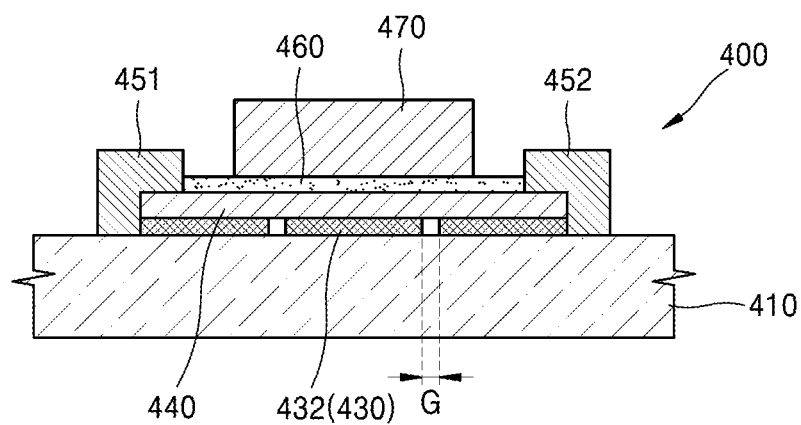
FIG. 7 is a cross-sectional view illustrating a structure of a graphene electronic device having a channel layer including graphene islands according to example embodiments.

FIG. 7 is a cross-sectional view illustrating a structure of a graphene electronic device 400 having a channel layer including graphene islands according to example embodiments. Like numerals are used to indicate like components as in the embodiment of FIG. 1 and detailed descriptions are omitted.

Referring to FIG. 7, one layer including a plurality of graphene islands 432, hereinafter referred to as a graphene layer 430, may be placed on a substrate 410. A semiconductor layer 440 may be on the graphene layer 430. A source electrode 451 and a drain electrode 452 each connected to both ends of the semiconductor layer 440 may be placed on the substrate 410. A gate insulating layer 460 and a gate electrode 470 may be sequentially placed on the semiconductor layer 440.

The substrate 410 may be a non-conductive substrate. The substrate 410 may be formed of, for example, glass, plastic, polymer, etc. An insulating layer (not shown) may be further disposed between the substrate 410 and the graphene layer 430. In this case, the substrate 410 may be a conductive substrate.

The plurality of graphene islands 432 may be spaced apart from each other by a predetermined or given gap G. The plurality of graphene islands 432 may be in contact with the semiconductor layer 440. The gap G may have a width of about 1 nm to about 100 nm. The plurality of graphene islands 432 may include 1 to 3 layers of graphene and have characteristics of graphene.

The semiconductor layer 440 may include silicon, an organic semiconductor, an amorphous oxide semiconductor, a two-dimensional transition metal chalcogenide, or a III/V group compound semiconductor.

The organic semiconductor may include pentacene.

The amorphous oxide semiconductor may be ZnO, ZnAlO, InZnO, or InGaZnO. The amorphous oxide semiconductor may be transparent and stable. Since the amorphous oxide semiconductor may form the semiconductor layer 440 in a solution state, the fabrication cost may be reduced.

The two-dimensional transition metal chalcogenide may include $MoS_2$, $WSe_2$, $WS_2$, $MoSe_2$, etc.

The graphene layer 430 and the semiconductor layer 440 may function as a channel layer of a FET. The graphene layer 430 may provide a characteristic of high mobility, and the semiconductor layer 440 and the graphene layer 430 may form a Schottky barrier therebetween and thus, provide a bandgap. Due to an existence of the bandgap, an on/off current ratio may increase.

The source electrode 451 and the drain electrode 452 may include materials well known in the semiconductor process, and a detailed description is omitted.

An operation of the graphene electronic device 400 in FIG. 7 may be well known from the embodiments described above, and a detailed description is omitted.

Figure 8:
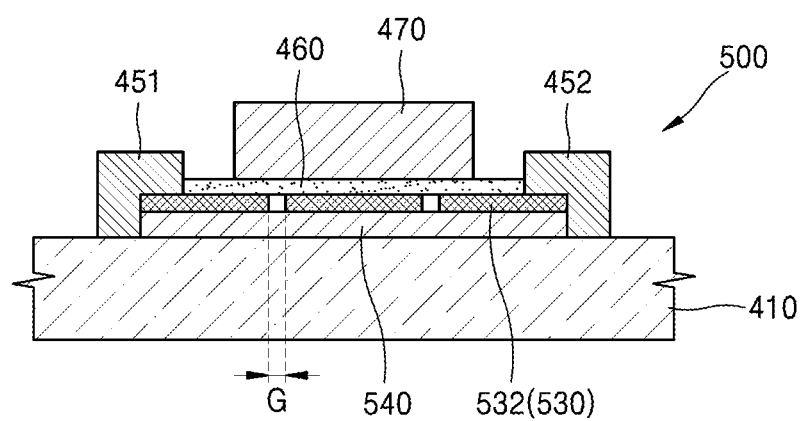
FIG. 8 is a cross-sectional view illustrating a structure of a graphene electronic device having a channel layer including graphene islands according to example embodiments.

FIG. 8 is a cross-sectional view illustrating a structure of a graphene electronic device 500 having a channel layer including graphene islands according to example embodiments. Like numerals are used to indicate like components as in the embodiment of FIG. 7 and detailed descriptions are omitted.

Referring to FIG. 8, a semiconductor layer 540 may be on a substrate 410. One layer including a plurality of graphene islands 532, hereinafter referred to as a graphene layer 530, may be placed on a semiconductor layer 540. A source electrode 451 and a drain electrode 452 connected to both ends of the semiconductor layer 540 may be placed on the substrate 410. A gate insulating layer 460 and a gate electrode 470 may be sequentially placed on the graphene layer 530.

The substrate 410 may be a non-conductive substrate. The substrate 410 may be formed of, for example, glass, plastic, polymer, etc. An insulating layer (not shown) may be further disposed between the substrate 410 and the graphene layer 530. In this case, the substrate 410 may be a conductive substrate.

Locations of the graphene layer 530 and the semiconductor layer 540 of the graphene electronic device 500 in FIG. 8 are different from those of the graphene electronic device 400 in FIG. 7, however, operations of the graphene electronic device 500 may be well understood from the example embodiment described above, and a detailed description is omitted.

It should be understood that example embodiments described herein should be considered in a descriptive sense only and not for purposes of limitation. Descriptions of features or aspects within each example embodiment should typically be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A graphene electronic device comprising:
   a channel layer including a semiconductor layer and a graphene layer in direct contact with the semiconductor layer, the graphene layer including a plurality of graphene islands spaced apart from each other;
a gate insulating layer connected to the channel layer such that the channel layer is on the gate insulating layer or the gate insulating layer is on the channel layer;
a gate electrode connected to the gate insulating layer such that the gate insulating layer is between the channel layer and the gate electrode; and
a source electrode connected to one end of the channel layer and a drain electrode connected another end of the channel layer.

2. The graphene electronic device of claim 1, wherein
the gate electrode is a conductive substrate,
the gate insulating layer is on the conductive substrate,
the channel layer is on the gate insulating layer, and
the source electrode is on the one end of the channel layer and the drain electrode is on the another end of the channel layer.

3. The graphene electronic device of claim 2, wherein the semiconductor layer includes one of silicon, an organic semiconductor, an amorphous oxide semiconductor, a two-dimensional transition metal chalcogenide, and a Group III/V compound semiconductor.

4. The graphene electronic device of claim 3, wherein the semiconductor layer includes InZnO.

5. The graphene electronic device of claim 4, wherein the semiconductor layer has a thickness of about 1 nm to about 30 nm.

6. The graphene electronic device of claim 2, wherein the plurality of graphene islands are spaced apart from each other by a gap of about 1 nm to about 100 nm.

7. The graphene electronic device of claim 4, wherein the plurality of graphene islands includes 1 to 3 layers of graphene.

8. The graphene electronic device of claim 2, wherein the plurality of graphene islands are between the gate insulating layer and the semiconductor layer.

9. The graphene electronic device of claim 1, comprising:
a substrate, wherein
the channel layer is on the substrate,
the gate insulating layer is on the channel layer,
the gate electrode is on the gate insulating layer, and
the source electrode is on the one end of the channel layer and the drain electrode is on the another end of the channel layer.

10. The graphene electronic device of claim 9, wherein the semiconductor layer includes one of silicon, an organic semiconductor, an amorphous oxide semiconductor, a two-dimensional transition metal chalcogenide, and a Group III/V compound semiconductor.

11. The graphene electronic device of claim 10, wherein the semiconductor layer includes InZnO.

12. The graphene electronic device of claim 11, wherein the semiconductor layer has a thickness of about 1 nm to about 30 nm.

13. The graphene electronic device of claim 9, wherein the plurality of graphene islands are spaced apart from each other by a gap of about 1 nm to about 100 nm.

14. The graphene electronic device of claim 11, wherein the plurality of graphene islands includes 1 to 3 layers of graphene.

15. The graphene electronic device of claim 9, wherein the plurality of graphene islands are between the gate insulating layer and the semiconductor layer.

\* \* \* \* \*